(12) United States Patent
Eo et al.

(10) Patent No.: US 10,121,924 B2
(45) Date of Patent: Nov. 6, 2018

(54) SOLAR CELL HAVING REAR BUFFER LAYER AND METHOD OF MANUFACTURING THE SAME

(71) Applicant: KOREA INSTITUTE OF ENERGY RESEARCH, Daejeon (KR)

(72) Inventors: Young Joo Eo, Daejeon (KR); Ara Cho, Seoul (KR); Jun Sik Cho, Daejeon (KR); Joo Hyung Park, Daejeon (KR); Kyung Hoon Yoon, Daejeon (KR); Se Jin Ahn, Daejeon (KR); Ji Hye Gwak, Daejeon (KR); Jae Ho Yun, Daejeon (KR); Kee Shik Shin, Daejeon (KR); Seoung Kyu Ahn, Daejeon (KR); Jin Su You, Seoul (KR); Sang Hyun Park, Daejeon (KR)

(73) Assignee: KOREA INSTITUTE OF ENERGY RESEARCH, Daejeon (KR)

( * ) Notice: Subject to any disclaimer, the term of this patent is extended or adjusted under 35 U.S.C. 154(b) by 302 days.

(21) Appl. No.: 14/770,455

(22) PCT Filed: Aug. 6, 2013

(86) PCT No.: PCT/KR2013/007086
§ 371 (c)(1),
(2) Date: Aug. 25, 2015

(87) PCT Pub. No.: WO2014/142400
PCT Pub. Date: Sep. 18, 2014

(65) Prior Publication Data
US 2016/0005899 A1  Jan. 7, 2016

(30) Foreign Application Priority Data

Mar. 12, 2013 (KR) ........................ 10-2013-0026377

(51) Int. Cl.
*H01L 31/0749* (2012.01)
*H01L 31/0465* (2014.01)
(Continued)

(52) U.S. Cl.
CPC .... *H01L 31/0465* (2014.12); *H01L 31/02167* (2013.01); *H01L 31/02168* (2013.01);
(Continued)

(58) Field of Classification Search
CPC ....... H01L 31/02167; H01L 31/022441; H01L 31/02245; H01L 31/022458; H01L 31/046;
(Continued)

(56) References Cited

U.S. PATENT DOCUMENTS

2009/0235987 A1* 9/2009 Akhtar ................. C01B 19/002
136/262
2010/0154876 A1* 6/2010 Camalleri ............ H01L 31/182
136/255

(Continued)

*Primary Examiner* — Susan D Leong
*Assistant Examiner* — Dujuan A Horton
(74) *Attorney, Agent, or Firm* — Birch, Stewart, Kolasch & Birch, LLP

(57) ABSTRACT

The invention relates a thin-film solar cell. In the related art, a buffer layer, a transparent electrode, and a grid electrode are formed on a light absorption layer, but in the invention, the buffer layer and the transparent electrode are not formed on a light absorption layer, and the buffer layer, the transparent electrode, and the grid electrode are formed under a CIGS face such that solar light is directly input to the light absorption layer without obstacles, and the first electrode and the buffer layer are patterned in a saw-toothed structure to engage with each other to reduce a distance by which electrons or holes generated by absorbing light energy move to the electrode or the buffer layer.

15 Claims, 9 Drawing Sheets

(51) Int. Cl.
*H01L 31/0216* (2014.01)
*H01L 31/0224* (2006.01)
*H01L 31/0236* (2006.01)
*H01L 31/18* (2006.01)

(52) U.S. Cl.
CPC ............... *H01L 31/02366* (2013.01); *H01L 31/022433* (2013.01); *H01L 31/022466* (2013.01); *H01L 31/022483* (2013.01); *H01L 31/0749* (2013.01); *H01L 31/18* (2013.01); *H01L 31/1884* (2013.01); *Y02E 10/541* (2013.01)

(58) Field of Classification Search
CPC ............ H01L 31/0463; H01L 31/0465; H01L 31/0468; H01L 31/047; H01L 31/0475; Y02E 10/541
USPC .................................... 136/244, 256
See application file for complete search history.

(56) References Cited

U.S. PATENT DOCUMENTS

2011/0201143 A1* 8/2011 Westin ............ H01L 31/022425
 438/66
2012/0073647 A1* 3/2012 Stangl ............. H01L 31/022441
 136/256
2014/0069498 A1* 3/2014 Cho ................ H01L 31/022425
 136/256

\* cited by examiner

[Fig. 1a]
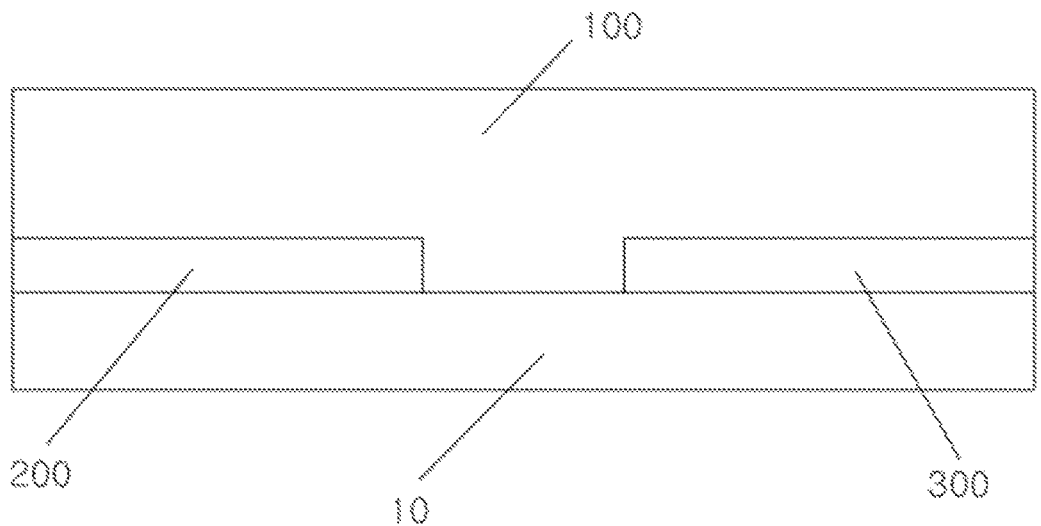
[Fig. 1b]
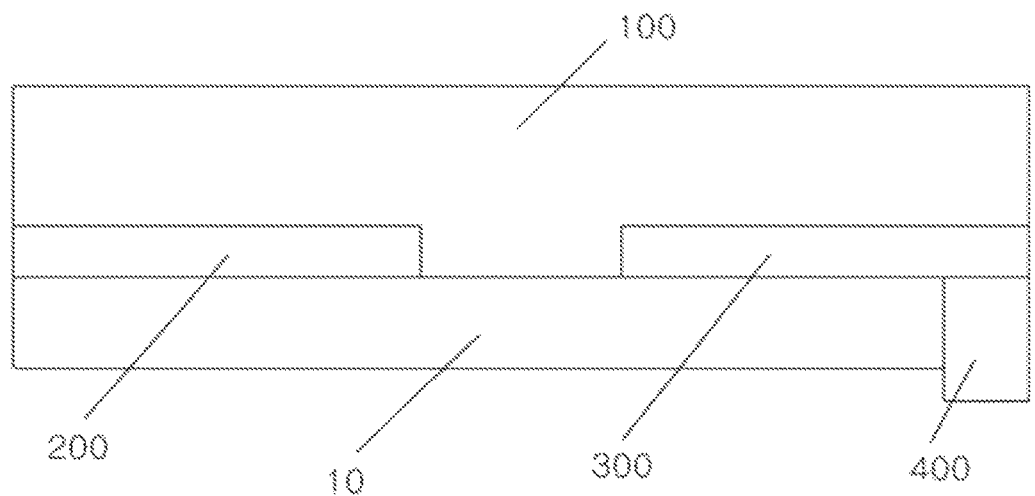

[Fig. 1c]
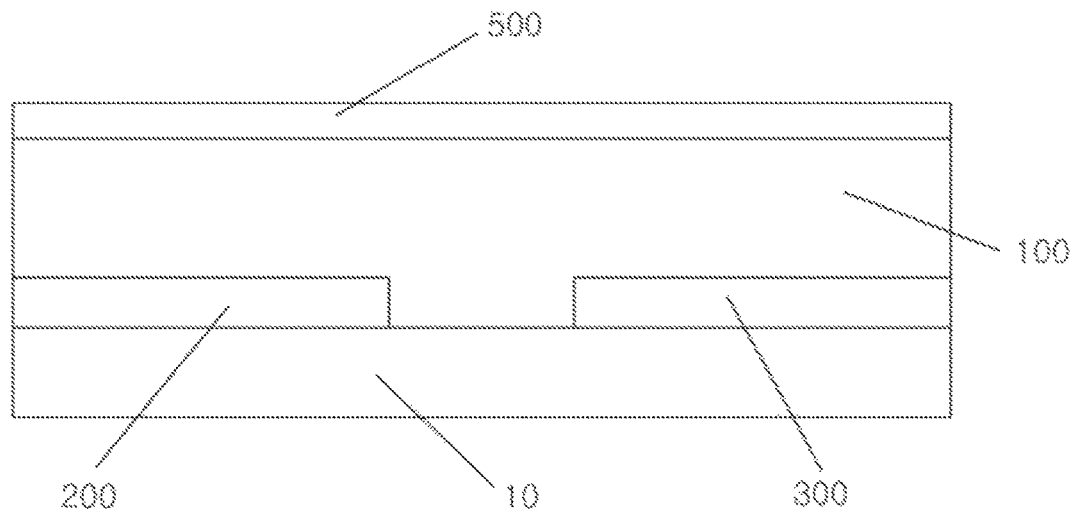
[Fig. 1d]
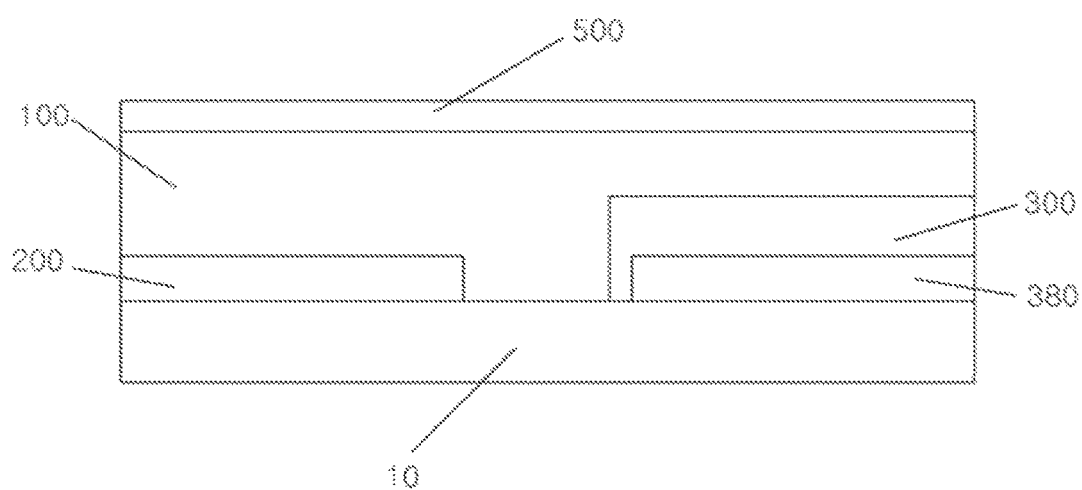

[Fig. 2a]
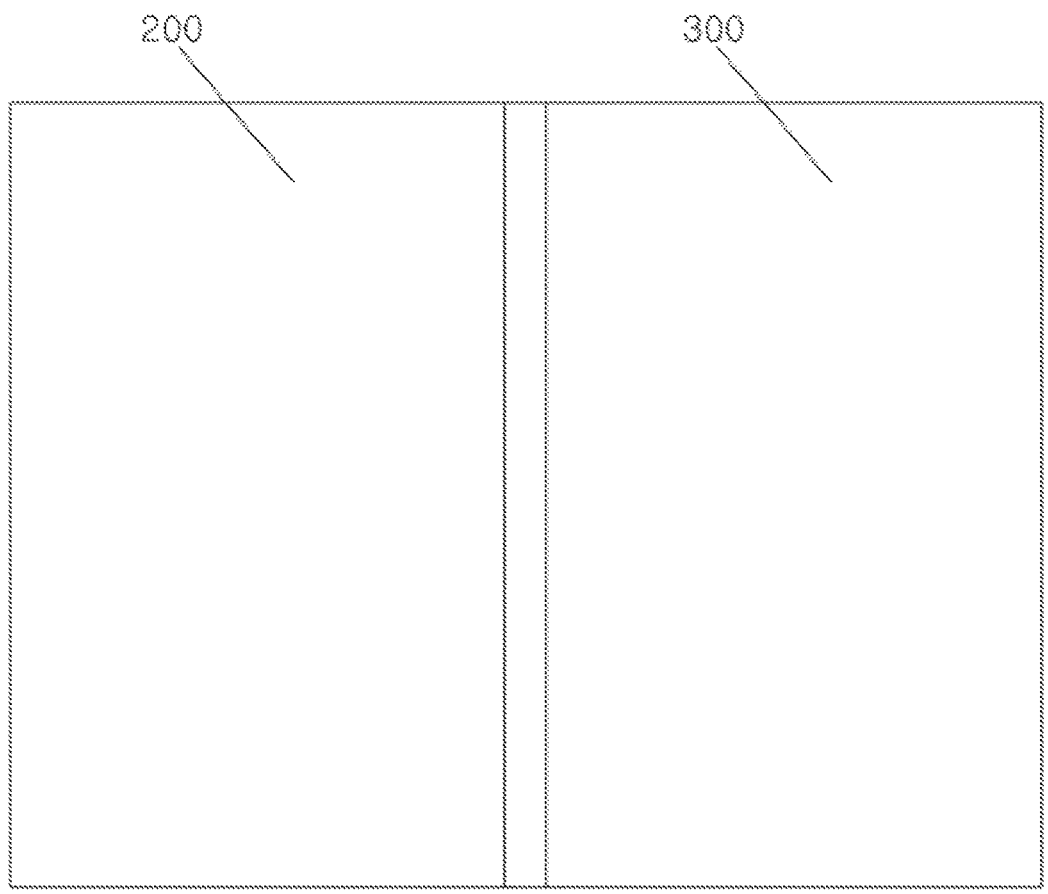

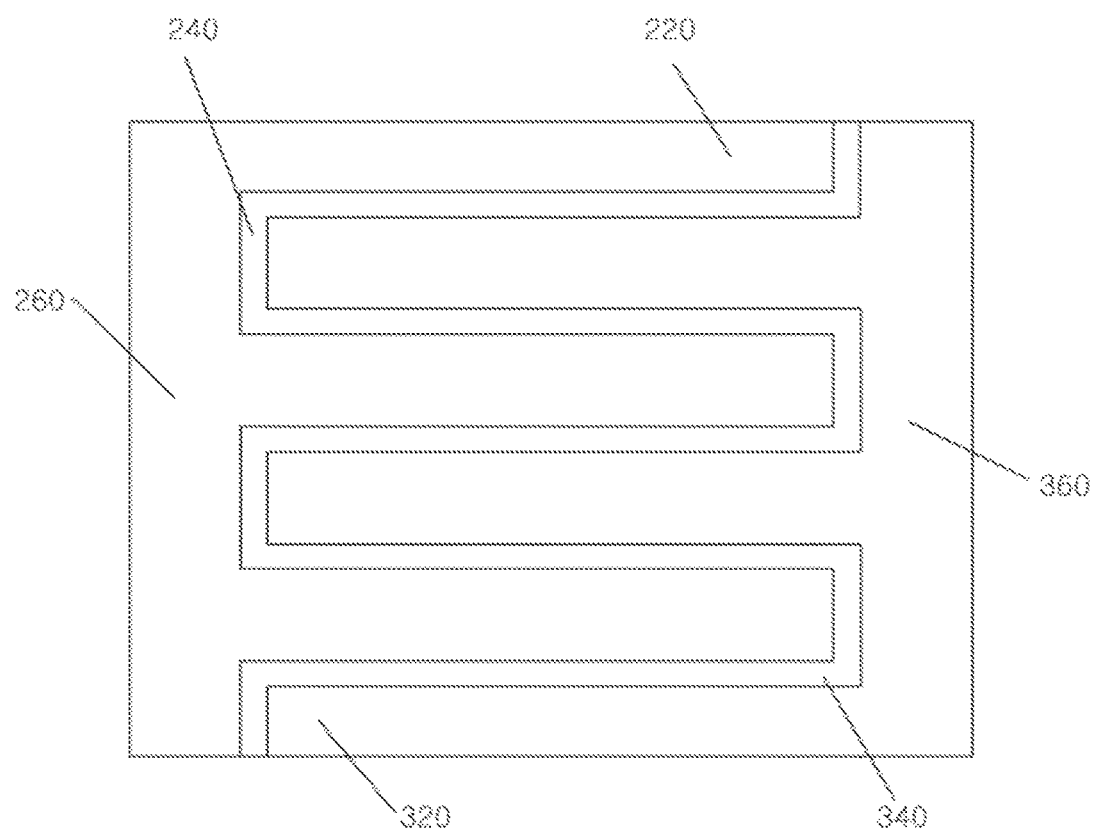
[Fig. 2b]

[Fig. 3]
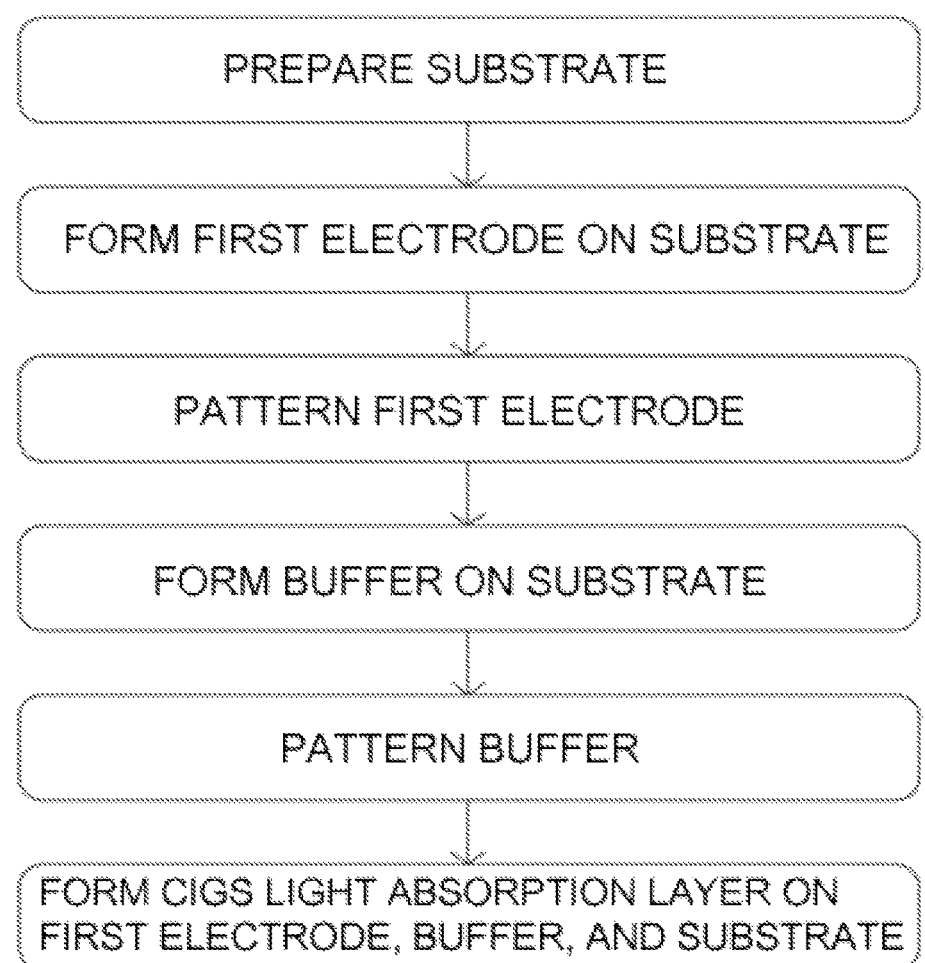

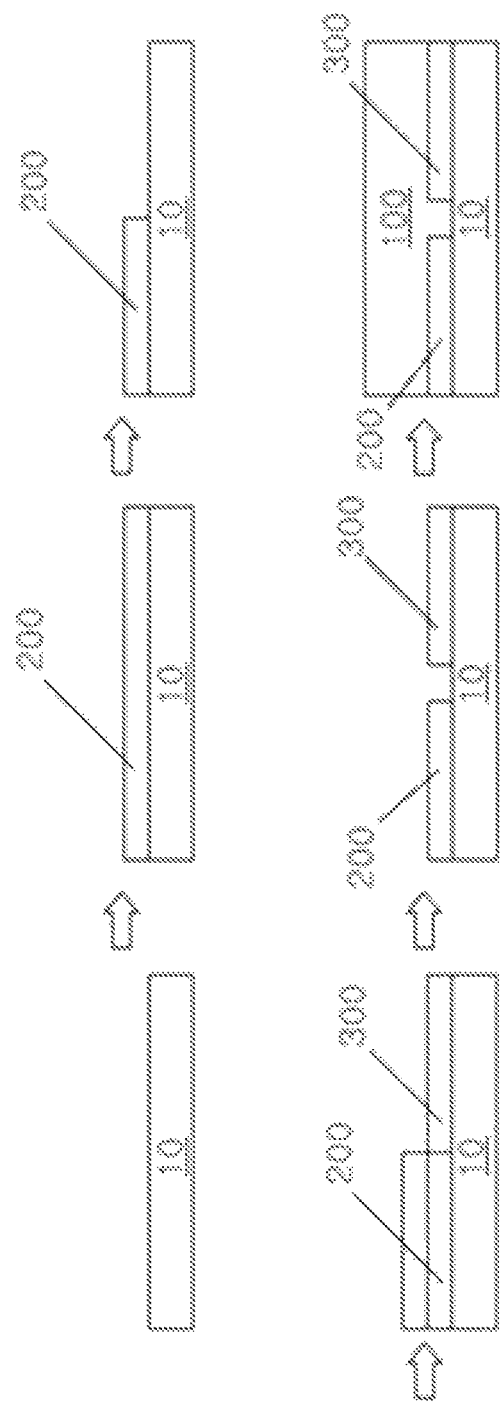
[Fig. 4]

[Fig. 5]
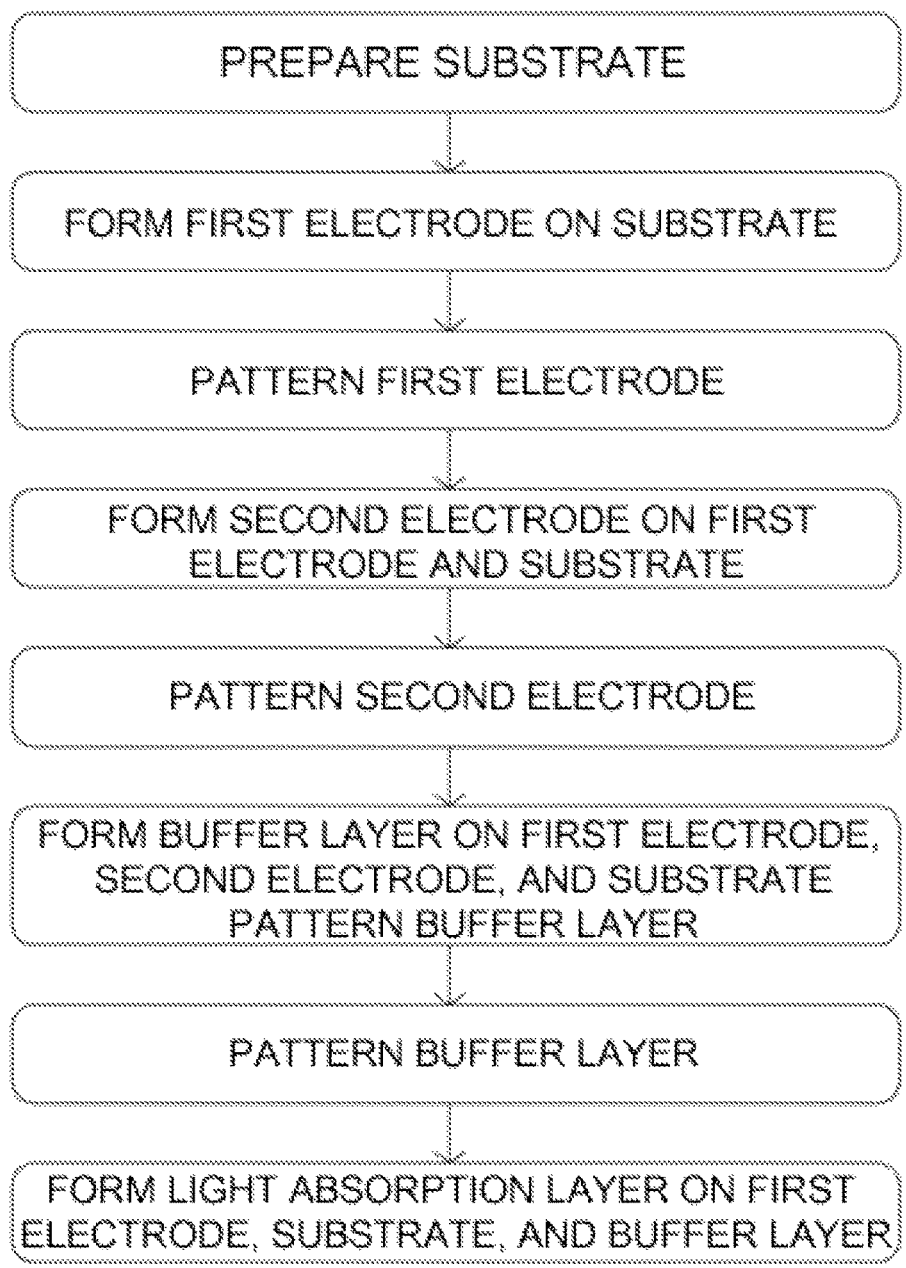

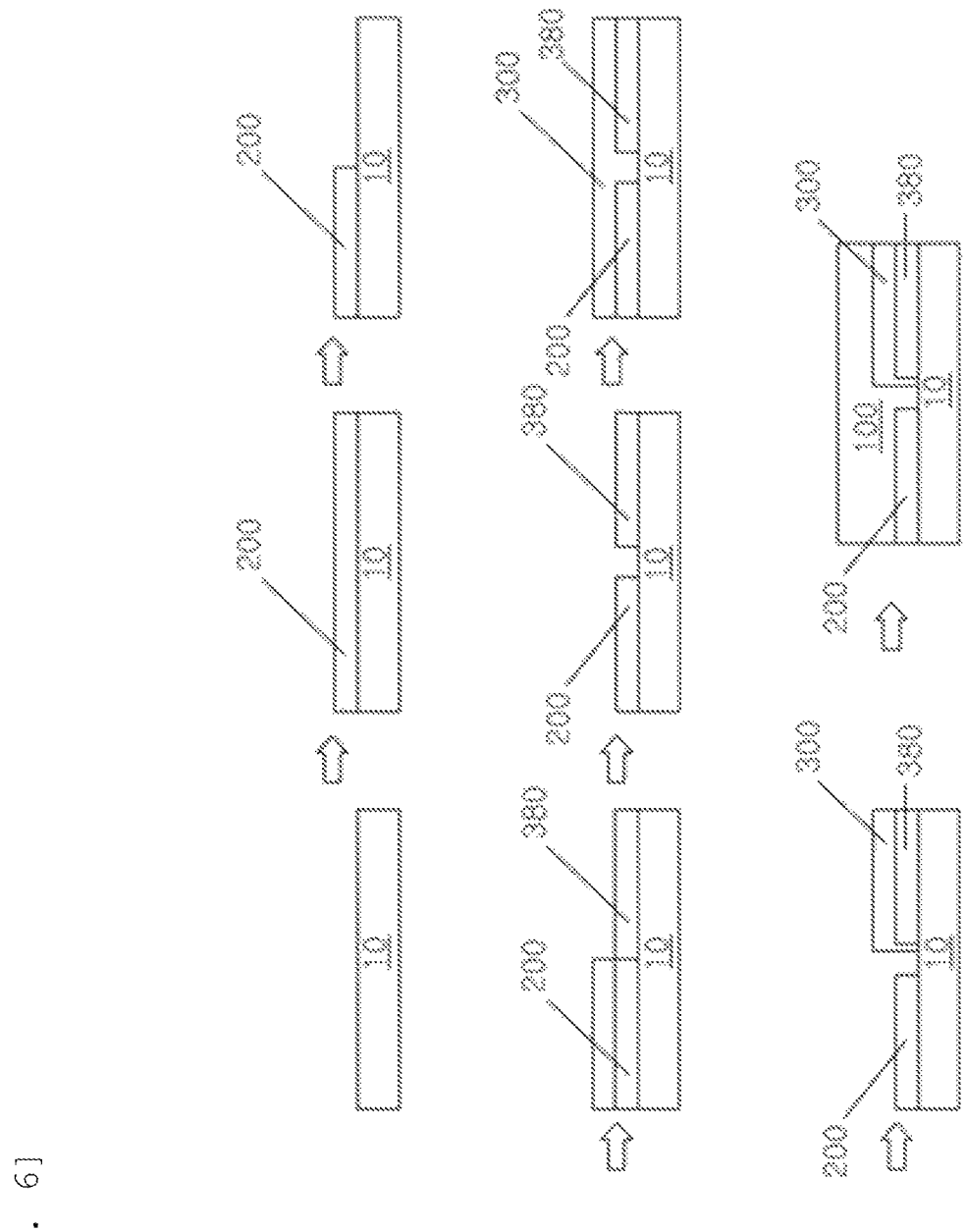
[Fig. 6]

[Fig. 7]
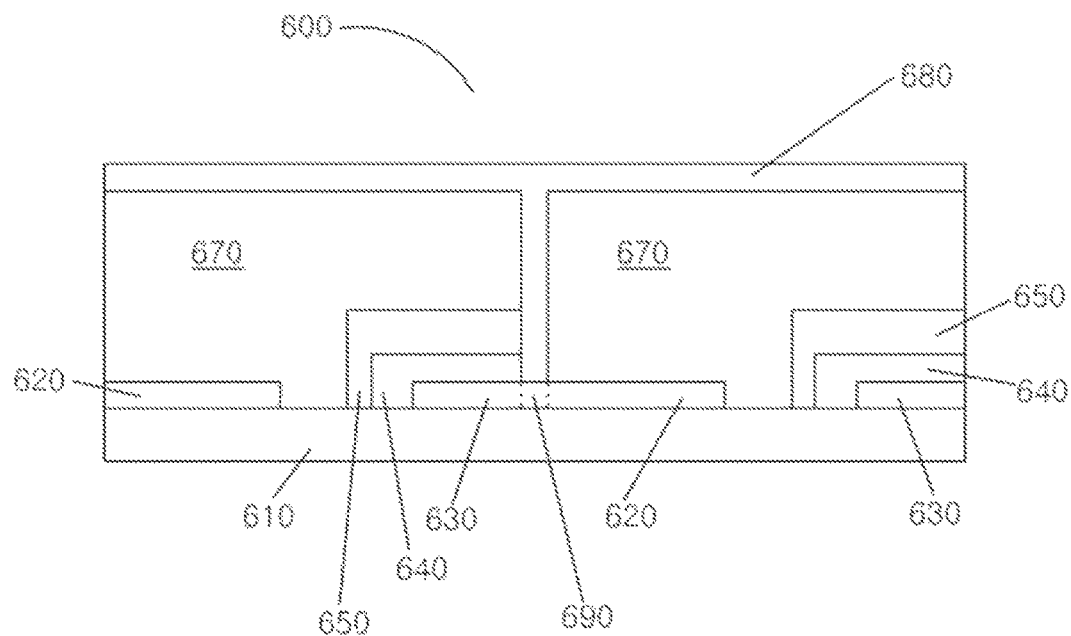

SOLAR CELL HAVING REAR BUFFER LAYER AND METHOD OF MANUFACTURING THE SAME

TECHNICAL FIELD

The present invention relates to a CIGS solar cell in which a buffer, a transparent electrode, and a grid electrode are formed under a CIGS light absorption layer such that solar light is input to the light absorption layer without obstacles.

BACKGROUND ART

A solar cell generates electricity using properties of a semiconductor, specifically, has a PN junction structure in which a P-type (positive) semiconductor and an N-type (negative) semiconductor are joined. When solar light is input to such a solar cell, holes and electrons are generated in the semiconductor by energy of the input solar light. In this case, by electric field on the PN junction, the holes are moved to the P-type semiconductor layer and the electrons are moved to the N-type semiconductor, thereby generating electric potential.

Solar cells may be classified into a substrate-type solar cell and a thin-film-type solar cell. The substrate-type solar cell is manufactured using a semiconductor material such as silicon as a substrate, and the thin-film-type solar cell is manufactured by forming a semiconductor layer in a thin-film form on a substrate such as glass. Recently, it is planned to improve efficiency through development of solar cells using the CIGS light absorption layer.

In order to raise photoelectric conversion efficiency of the solar cell, a ratio of the solar light absorbed to the light absorption layer has to be raised. In a case of the thin-film-type solar cell, it is possible to lower the manufacturing cost by using the light absorption layer of the thin film as compared with the substrate-type solar cell, but there is a problem that the light absorption rate is lowered. As a plan to overcome the decrease of the light absorption rate described above, it is necessary to increase the amount of solar light reaching the light absorption layer.

The thin-film-type solar cell generally has a structure of substrate/rear electrode/CIGS light absorption layer/buffer layer/front electrode. The solar light has to pass through the front electrode and the buffer layer to reach the light absorption layer. Accordingly, the front electrode and the buffer layer have to be made using materials with transmissivity of light, and the amount of solar light reaching the light absorption layer increases as the transmissivity of light gets higher, thereby further raising the photoelectric conversion efficiency.

(Patent Document 1) Korean Registered Patent Publication Registration No. 10-1108988 has an effect capable of realizing low reflection and high absorption of incident light by forming a front transparent electrode having a surface-crystalline uneven structure in the CIGS solar cell module. To this end, particularly, there is provided a CIGS solar cell module with a front transparent electrode having a surface-crystalline uneven structure, including: a rear electrode that is formed on a predetermined substrate; a CIGS light absorption layer that is formed on the rear electrode; a buffer layer that is formed on the CIGS light absorption layer; a front transparent electrode that is formed around the buffer layer and refracts predetermined incident light to transfer the incident light to the CIGS light absorption layer; and a reflection preventing film that is formed to prevent the incident light from being reflected on the front transparent electrode, wherein the front transparent electrode is formed of fluorine-contained tin oxide, and a surface-crystalline uneven structure for refraction is provided on the surface coming in contact with the reflection preventing film. The CIGS solar cell module is provided with the front transparent electrode having the surface-crystalline uneven structure, it is possible to thereby realize low reflection and high absorption of incident light, and there is an advantage that it is possible to adjust an unevenness angle capable of adjusting reflectivity in forming the surface-crystalline uneven structure of the front transparent electrode in the CIGS solar cell module. However, there is a disadvantage that the transparent electrode itself absorbs some of solar light.

SUMMARY OF INVENTION

Technical Problem

In order to raise photoelectric conversion efficiency of a solar cell, the ratio of solar light absorbed into the light absorption layer should be raised. In the case of the thin-film-type solar cell, it is possible to lower the manufacturing cost by using a thin film light absorption layer as compared with the substrate-type solar cell, but there is a problem that the light absorption rate is lowered. In order to overcome the decrease of the light absorption rate described above, it is necessary to increase the amount of solar light reaching the light absorption layer.

The thin-film-type solar cell generally has a structure of substrate/rear electrode/CIGS light absorption layer/buffer layer/front electrode. The solar light has to pass through the front electrode and the buffer layer to reach the light absorption layer. Accordingly, the front electrode and the buffer layer have to be made using materials that have transmissivity of light, and the amount of solar light reaching the light absorption layer increases as the transmissivity of light gets higher, thereby further raising the photoelectric conversion efficiency.

The object of this invention is to solve the problem that some of solar light is reflected on or absorbed to the buffer layer, the front electrode, and the grid electrode in the CIGS solar cell and thereby does not reach the light absorption layer, and to provide a CIGS solar cell with increased amount of solar light reaching the light absorption layer to raise efficiency.

Solution to Problem

According to the invention, in order to solve the problem above, the buffer layer, the front electrode, and the grid electrode generally positioned on the light absorption layer are not formed on the light absorption layer, and the solar light can thereby reach the light absorption layer without passing through the unit functional film. Some of the solar light that had been reflected on the grid electrode or absorbed to the front electrode and the buffer layer, can directly reach the light absorption layer without loss.

The solar cell has a PN junction structure, electron-hole pairs are generated from solar light energy, and electric energy is generated while the holes move to the P-type semiconductor and the electrons move to the N-type semiconductor. When the buffer layer corresponding to the N-type semiconductor layer is not formed on the CIGS light absorption layer, it is necessary to form a buffer layer at the lower portion to keep such a PN junction structure. In the invention, a first electrode and a buffer layer are formed so as not to be electrically connected to each other under the CIGS light absorption layer. A grid electrode is formed under the buffer layer, and the solar light can reach the light absorption layer without obstacles on the CIGS light absorption layer.

Considering the distance of the electron-hole pairs moving to the first electrode or the buffer layer in the light absorption layer, it is possible to reduce the movement distance of the electrons or the holes by manufacturing the buffer layer and the first electrode to engage in a saw-toothed shape.

Advantageous Effect(s) of Invention

Since the buffer layer, the front electrode, and the grid electrode are not formed on the light absorption layer, the solar light can reach the light absorption layer without passing through the unit functional films. Some of the solar light that had been reflected on the grid electrode or absorbed to the front electrode and the buffer layer can directly reach the light absorption layer without loss. Since the amount of solar light reaching the light absorption layer is increased, it is possible to raise efficiency of the solar cell. It is possible to reduce the movement distance of the electrons or the holes by disposing the buffer layer and the first electrode to engage in a saw-toothed shape.

BRIEF DESCRIPTION OF DRAWING(S)

FIGS. 1a, 1b, 1c, and 1d are a diagram illustrating a configuration of a solar cell having a rear buffer layer.

FIGS. 2a and 2b are a schematic diagram illustrating an embodiment capable of patterning a first electrode and a buffer.

FIG. 3 is a flowchart illustrating stepwise the method of manufacturing a solar cell having a rear buffer layer.

FIG. 4 is a schematic diagram illustrating stepwise the method of manufacturing a solar cell having a rear buffer layer.

FIG. 5 is a flowchart illustrating stepwise the method of manufacturing a solar cell including an electrode between a rear buffer layer and a substrate.

FIG. 6 is a schematic diagram illustrating stepwise the method of manufacturing a solar cell including an electrode between a rear buffer layer and a substrate.

FIG. 7 is a diagram illustrating a configuration of a solar cell module having a serial connection structure between unit cells according to an embodiment, using a solar cell having a rear buffer layer as a unit cell.

DESCRIPTION OF EMBODIMENT(S)

An embodiment of a solar cell having a rear buffer layer and the method of manufacturing the same will be described with reference to the accompanying drawings.

FIG. 1 is a diagram illustrating the configuration of a solar cell having a rear buffer layer according to the invention, and the solar cell includes: a substrate 10; a first electrode 200 that is formed in a specific area on the substrate 10; a buffer layer 300 that is disposed separately at a predetermined gap from the first electrode 200; and a light absorption layer 100 that is formed on the first electrode 200, the buffer layer 300, and the substrate between the first electrode 200 and the buffer layer 300. In this case, when light is input to the light absorption layer, electro-hole pairs are generated, the electrons move to the buffer layer, and the holes move to the first electrode. Electric energy is generated using a principle in which the electrons and the holes are separated by absorbing the light energy as described above. Accordingly, the first electrode 200 and the buffer layer 300 are electrically separated from each other by a material of the light absorption layer 100. The buffer layer 300 is positioned under the light absorption layer 100 to increase the amount of incident light of the light absorption layer 100.

FIG. 2 is a schematic diagram illustrating an embodiment of patterning the first electrode and the buffer layer. The first electrode 200 and the buffer layer 300 are disposed in the same layer under the light absorption layer 100, but are formed at a predetermined space to electrically separate them. When the first electrode 200 and the buffer layer 300 are patterned, it is considerable that the left of the lower face of the light absorption layer 100 is formed into the first electrode 200, and the right is formed into the buffer layer 300. In this case, when the electro-hole pairs are generated on the left of the light absorption layer 100, the distance between the holes and the first electrode 200 is short, but the distance between the electrons and the buffer layer 300 is long, which is a problem. In addition, when the electro-hole pairs are generated on the right of the light absorption layer 100, the distance between the electrons and the buffer layer 300 is short, but the distance between the holes and the first electrode 200 is long, which is a problem. In order to shorten the distance of the electrons or the holes moving to the first electrode 200 or the buffer layer 300, it is necessary that the first electrode 200 and the buffer layer 300 be distributed and positioned on both the left and the right of the light absorption layer 100. In FIG. 2b, a patterning having a saw-toothed structure is shown, and through such a saw-toothed patterning, it can be confirmed that it is possible to shorten the movement distance to the electrode or the buffer layer even when the electron-hole pairs are formed at any position of the light absorption layer. One face of the first electrode 200 opposed to the buffer layer 300 includes a saw-toothed pattern including a first electrode protrusion portion 200, a first electrode depression portion 240, and a connection portion 260 that electrically connects the first electrode protrusion portion and the first depression portion. The first electrode protrusion portion 220 is inserted into a depression portion 340 of the buffer layer and is disposed separately at a predetermined space, and a protrusion portion 320 of the buffer layer is inserted into the first electrode depression portion 240 and is disposed separately at a predetermined distance.

The first electrode 200 may include any one of nickel, copper, and molybdenum, and it is preferable to use molybdenum, but is not limited to the embodiment.

The buffer layer 300 includes at least any one of CdS, CdZnS, ZnS, Zn(S,O), Zn(OH,S), ZnS(O,OH), ZnSe, ZnInS, ZnInSe, ZnMgO, Zn(Se,OH), ZnSnO, ZnO, InSe, InOH, In(OH,S), In(OOH,S), and In(S,O), but is not limited to the embodiment.

The solar cell may further include a grid electrode in contact with the buffer layer 300, and the grid electrode 400 may include at least any one of aluminum and nickel.

In addition, the solar cell may further include a reflection preventing layer 500 on the light absorption layer 100, and the reflection preventing layer 500 may include: a first reflection preventing layer that is formed on the light absorption layer 100 and includes $Al_2O_3$; and a second reflection preventing layer that is formed on the first reflection preventing layer and includes $MgF_2$.

As illustrated in FIG. 1d, the solar cell may further include a second electrode 380 between the substrate 10 and the buffer layer 300. In this case, the second electrode 380 may include at least any one of zinc oxide, gallium oxide, aluminum oxide, indium oxide, lead oxide, copper oxide, titanium oxide, tin oxide, iron oxide, tin dioxide, and indium tin oxide, but is not limited to the embodiment. A structure in which the second electrode is formed under the buffer layer in the same dimension as that of the buffer layer exhibits high efficiency.

The light absorption layer may include any one selected from a CIS/CIGS-based compound group including Cu—In—Se, Cu—In—S, Cu—Ga—S, Cu—Ga—Se, Cu—In—Ga—Se, Cu—In—Ga—Se—(S,Se), Cu—In—Al—Ga—(S,Se), and Cu—In—Al—Ga—Se—S. When the solar light is input to the light absorption layer, it is possible to generate electric energy using the principle of absorbing solar light energy to form electro-hole pairs.

FIG. 3 is a flowchart illustrating stepwise the method of manufacturing a solar cell having a rear buffer layer, and FIG. 4 is a schematic diagram illustrating stepwise the method of manufacturing a solar cell having a rear buffer layer. The method of manufacturing a solar cell includes: a step of preparing a substrate 10; a step of forming a first electrode 200 on the substrate 10; a step of patterning the first electrode 200 to remove the first electrode 200 formed at a specific portion of the substrate 10; a step of forming a buffer layer 300 on the first electrode 200 and the substrate 10; a step of patterning the buffer layer 300 to dispose the buffer layer 300 at a predetermined gap from the first electrode 200; and (vi) a step of forming a light absorption layer 300 on the first electrode, the buffer layer, and the substrate between the first electrode and the buffer layer.

FIG. 5 is a flowchart illustrating stepwise the method of manufacturing a solar cell including a second electrode between a rear buffer layer and a substrate. FIG. 6 is a schematic diagram illustrating stepwise the method of manufacturing a solar cell including an electrode between a rear buffer layer and a substrate. The method of manufacturing a solar cell includes: a step of preparing a substrate; a step of forming a first electrode on the substrate; a step of patterning the first electrode to remove the first electrode formed at a specific portion of the substrate; a step of forming a second electrode on the first electrode and the substrate; a step of patterning the second electrode to dispose the second electrode at a predetermined gap from the first electrode; a step of forming a buffer layer on the first electrode, the second electrode, and the substrate; a step of patterning the buffer layer to dispose the buffer layer at a predetermined gap from the first electrode; and a step of forming a light absorption layer on the first electrode, the buffer layer, and the substrate between the first electrode and the buffer layer.

In this case, the second electrode includes at least any one of zinc oxide, gallium oxide, aluminum oxide, indium oxide, lead oxide, copper oxide, titanium oxide, tin oxide, iron oxide, tin dioxide, and indium tin oxide, and may be formed using any one method of RF sputtering, reactive sputtering, evaporation, E-beam evaporation, metalorganic chemical vapor deposition (MOCVD), atomic layer epitaxy, atomic layer deposition, molecular beam epitaxy (MBE), and electrodeposition, but is not limited the embodiment.

The first electrode 200 includes any one of molybdenum, nickel, and copper, and may be formed by any one method of sputtering, thermal evaporation, E-beam evaporation, and electrodeposition, and it not limited to the embodiment.

The buffer layer 300 may include any one of CdS, CdZnS, ZnS, Zn(S,O), Zn(OH,S), ZnS(O,OH), ZnSe, ZnInS, ZnInSe, ZnMgO, Zn(Se,OH), ZnSnO, ZnO, InSe, InOH, In(OH,S), In(OOH,S), and In(S,O), and may be formed by any one of chemical bath deposition (CBD), electrodeposition, covaporation, sputtering, atomic layer epitaxy, atomic layer deposition, chemical vapor deposition (CVD), metalorganic chemical vapor deposition (MOCVD), molecular beam epitaxy (MBE), spray pyrolysis, ILGAR (ion layer gas reaction), and pulsed laser deposition, but is not limited to the embodiment.

In the patterning of the first electrode 200 and the buffer layer 300, one face of the first electrode 200 opposed to the buffer layer 300 has a saw-toothed pattern including a first electrode protrusion portion 220, a first electrode depression portion 240, and a connection portion 260 electrically connecting the first electrode protrusion portion and the first electrode depression portion, the first electrode protrusion portion 220 is inserted into the depression portion 340 of the buffer layer and is disposed separately at a predetermined space, and a protrusion portion 320 of the buffer layer is inserted into the first electrode depression portion 240 and is disposed separately at a predetermined space. When the saw-toothed patterning is performed, there is an advantage that the movement distance of the electron-hole pairs generated in the light absorption layer 100 to the first electrode 200 or the buffer layer 300 is shortened. The patterning of the first electrode 200 and the buffer layer 300 may use a laser scribing process, but is not limited to the embodiment. In patterning using the laser scribing process, when the first electrode 200 is patterned, the process may be performed in which a laser wavelength is 1064 nm and a laser power is 3 W, and when the buffer layer 300 is patterned, the process may be performed in which a laser wavelength is 532 nm and a laser power is 0.3 W.

The light absorption layer 100 includes any one selected from a CIS/CIGS-based compound group including Cu—In—Se, Cu—In—S, Cu—Ga—S, Cu—Ga—Se, Cu—In—Ga—Se, Cu—In—Ga—Se—(S,Se), Cu—In—Al—Ga—(S,Se), and Cu—In—Al—Ga—Se—S, and is formed by any one method of coevaporation, sputtering, electrodeposition, metalorganic chemical vapor deposition (MOCVD), molecular beam epitaxy (MBE), electrodeposition, screen printing, and particle deposition, but is not limited to the embodiment.

The method of manufacturing a solar cell may further include the step of forming a reflection preventing film 500 on the light absorption layer 100 after the step of forming the light absorption layer 100, and the step of forming the reflection preventing film 500 includes: a step of forming a first reflection preventing layer with $Al_2O_3$ by ALD (atomic layer deposition) using $Al(CH_3)_3$ and $O_3$ as reaction gas on the light absorption layer; and a step of forming a film by thermal evaporator using $MgF_2$ pellet on the first reflection preventing layer.

Embodiment(s)

FIG. 7 is a diagram illustrating a configuration of a solar cell module having a serial connection structure between unit cells according to an embodiment, using a solar cell having a rear buffer layer as a unit cell. The solar cell module 600 includes: a substrate 610; and a plurality of unit cells formed on the substrate 610. In this case, each unit cell includes: a first electrode 620 that is formed in a specific area on the substrate; a second electrode 630 that is disposed separately at a predetermined gap from the first electrode 620; a transparent electrode 640 that is formed on the second electrode 630 and on a side face of the second electrode 630 opposed to the first electrode 620, and is disposed separately from the first electrode 620; a buffer layer 650 that is formed on the transparent electrode 640 and on a side face of the transparent electrode 640 opposed to the first electrode 620, and is disposed separately from the first electrode 620; a light absorption layer 670 that is formed on the first electrode 620, the substrate 610, and the buffer layer 650; and a reflection preventing layer 680 that is formed on the light absorption layer 670. In this case, the solar cell module further includes a serial connection portion 690 that electrically connects the first electrode and the second electrode of each unit cell to have a serial connection structure.

The first electrode 620 may include any one of nickel, molybdenum, and copper, the second electrode 630 may include any one of nickel, molybdenum, and copper, and the serial connection portion 690 connecting the first electrode and the second electrode between the unit cells may include any one of nickel, molybdenum, and copper, but is not limited to the embodiment. The first electrode 620, the second electrode 630, and the serial connection portion 690 may be configured by materials different from each other, but the first electrode 620, the second electrode 630, and the serial connection portion 690 may be formed of the same material, for example, a method of patterning after depositing molybdenum on the substrate.

The transparent electrode 640 may include at least any one of zinc oxide, gallium oxide, aluminum oxide, indium oxide, lead oxide, copper oxide, titanium oxide, tin oxide, iron oxide, tin dioxide, and indium tin oxide, but is not limited to the embodiment. In this case, the transparent electrode 640 may be formed by a double layer, and the transparent electrode 640 may include: a lower transparent electrode that includes n-ZnO; and an upper transparent electrode that is formed on the lower transparent electrode and includes i-ZnO.

The buffer layer 650 may include at least any one of CdS, CdZnS, ZnS, Zn(S,O), Zn(OH,S), ZnS(O,OH), ZnSe, ZnInS, ZnInSe, ZnMgO, Zn(Se,OH), ZnSnO, ZnO, InSe, InOH, In(OH,S), In(OOH,S), and In(S,O), but is not limited to the embodiment.

The light absorption layer 670 may include any one selected from a CIS/CIGS-based compound group including Cu—In—Se, Cu—In—S, Cu—Ga—S, Cu—Ga—Se, Cu—In—Ga—Se, Cu—In—Ga—Se—(S,Se), Cu—In—Al—Ga—(S,Se), and Cu—In—Al—Ga—Se—S.

The reflection preventing layer 680 may include: a first reflection preventing layer that is formed on the light absorption layer 670 and includes $Al_2O_3$; and a second reflection preventing layer that is formed on the first reflection preventing layer and includes $MgF_2$.

The buffer layer serially connects the unit cells formed thereunder to configure the solar cell module, such that there is an advantage of increasing the amount of incident light to the light absorption layer, and there is an advantage of increasing the amount of incident light by employing the rear electrode structure. As described above, even in the solar cell module, in order to reduce the movement distance of the electrons or the holes to the first electrode or the buffer layer, it is possible to perform patterning to have a shape such as a saw-toothed structure.

The invention has been described with reference to the accompanying drawings, but the description is merely an embodiment of various embodiments including the gist of the invention, an object thereof is for a person skilled in the art to easily embody the invention, and it is clear that the invention is not limited to only the embodiment described above. Accordingly, the protection scope of the invention should be understood by the following claims, and all the technical spirits falling within the scope of the equivalents based on modification, substitution, and replacement within the scope which do not deviate from the gist of the invention are included in the right scope of the invention. In addition, a partial configuration of the drawings is to more clearly describe the configuration, and it is clarified that it is provided by exaggeration or reduction as compared with actual.

INDUSTRIAL APPLICABILITY

According to the invention, since the buffer layer, the front electrode, and the grid electrode are not formed on the light absorption layer, the solar light can reach the light absorption layer without passing through the unit functional films. Some of the solar light was reflected on the grid electrode or was absorbed to the front electrode and the buffer layer, but can directly reach the light absorption layer without loss. Since the amount of solar light reaching the light absorption layer is increased, it is possible to raise efficiency of the solar cell. The invention has high industrial applicability for such a reason.

The invention claimed is:

1. A solar cell comprising:
a substrate;
a first electrode that is formed in a specific area on the substrate;
a buffer layer that is disposed separately at a predetermined gap from the first electrode on the substrate;
a second electrode disposed on the substrate, and in between the substrate and the buffer layer, wherein the second electrode and the first electrode are in the same plane; and
a light absorption layer that is directly formed on the first electrode, the buffer layer, and the substrate, wherein the light absorption layer is directly formed on the portion of the substrate between the first electrode and the buffer layer,
wherein the first electrode, the buffer layer, and the second electrode are disposed on the same side of the light absorption layer, wherein the first electrode is electrically separated from the buffer layer and the second electrode by a material of the light absorption layer,
wherein the buffer layer is positioned under the light absorption layer to increase the amount of incident light of the light absorption layer,
wherein one face of the first electrode opposed to the buffer layer has a saw-toothed pattern including a first electrode protrusion portion, a first electrode depression portion, and a connection portion electrically connecting the first electrode protrusion portion and the first electrode depression portion,
wherein the first electrode protrusion portion is inserted into a depression portion of the buffer layer and is disposed separately at a predetermined space, and
wherein a protrusion portion of the buffer layer is inserted into the first electrode depression portion and is disposed separately at a predetermined space to shorten movement distance to the electrode or the buffer layer even when the electron-hole pairs are formed at any position of the light absorption layer.

2. The solar cell according to claim 1, wherein the first electrode includes any one of nickel, copper, and molybdenum.

3. The solar cell according to claim 1, wherein the buffer layer includes CdS, CdZnS, ZnS, Zn(S, O), Zn(OH, S), ZnS(O, OH), ZnSe, ZnInS, ZnInSe, ZnMgO, Zn(Se, OH), ZnSnO, ZnO, InSe, InOH, In (OH, S), In (OOH, S), and In (S, 0).

4. The solar cell according to claim 1, further comprising a grid electrode coming in contact with the buffer layer,
wherein the grid electrode includes at least any one of aluminum and nickel.

5. The solar cell according to claim 1, further comprising a reflection preventing layer on the light absorption layer.

6. The solar cell according to claim 5, wherein the reflection preventing layer includes:
a first reflection preventing layer that is formed on the light absorption layer and includes $Al_2O_3$; and
a second reflection preventing layer that is formed on the first reflection preventing layer and includes $MgF_2$.

7. The solar cell according to claim 1, wherein the second electrode includes at least any one of zinc oxide, gallium oxide, aluminum oxide, indium oxide, lead oxide, copper oxide, titanium oxide, tin oxide, iron oxide, tin dioxide, and indium tin oxide.

8. The solar cell according to claim 1, wherein the light absorption layer includes any one selected from a CIS/CIGS based compound group including Cu—In—Se, Cu—In—S, Cu—Ga—S, Cu—Ga—Se, Cu—In—Ga—Se, Cu—In—Ga—Se—(S, Se), Cu—In—Al—Ga—(S, Se), and Cu—In—Al—Ga—Se—S.

9. A solar cell module including solar unit cells connected in series, comprising:
a substrate; and
a plurality of unit cells,
wherein each unit cell includes:
a first electrode that is formed in a specific area on the substrate;
a second electrode that is disposed separately at a predetermined gap from the first electrode, wherein the second electrode and the first electrode are in the same plane;
a transparent electrode that is formed on the second electrode and on a side face of the second electrode opposed to the first electrode, and is disposed separately from the first electrode;
a buffer layer that is formed on the transparent electrode and on a side face of the transparent electrode opposed to the first electrode, and is disposed separately from the first electrode;
a light absorption layer that is directly formed on the first electrode, the substrate, and the buffer layer; and
a reflection preventing layer that is formed on the light absorption layer,
wherein the first electrode, the buffer layer, and the second electrode are disposed on the same side of the light absorption layer, wherein the first electrode is electrically separated from the buffer layer and the second electrode by a material of the light absorption layer wherein the solar cell module further comprises a serial connection portion that electrically connects the first electrode and the second electrode of each unit cell to have a serial connection structure,
wherein the buffer layer is disposed under the light absorption layer to increase the amount of incident light,
wherein one face of the first electrode opposed to the buffer layer has a saw-toothed pattern including a first electrode protrusion portion, a first electrode depression portion, and a connection portion electrically connecting the first electrode protrusion portion and the first electrode depression portion,
wherein the first electrode protrusion portion is inserted into a depression portion of the buffer layer and is disposed separately at a predetermined space, and
wherein a protrusion portion of the buffer layer is inserted into the first electrode depression portion and is disposed separately at a predetermined space to shorten movement distance to the electrode or the buffer layer even when the electron-hole pairs are formed at any position of the light absorption layer.

10. The solar cell module according to claim 9, wherein the first electrode includes any one of nickel, molybdenum, and copper.

11. The solar cell module according to claim 9, wherein the second electrode includes one of nickel, molybdenum, and copper.

12. The solar cell module according to claim 9, wherein the transparent electrode includes at least any one of zinc oxide, gallium oxide, aluminum oxide, indium oxide, lead oxide, copper oxide, titanium oxide, tin oxide, iron oxide, tin dioxide, and indium tin oxide.

13. The solar cell module according to claim 9, wherein the buffer layer includes at least any one of CdS, CdZnS, ZnS, Zn (S, 0), Zn (OH, S), ZnS (0, OH), ZnSe, ZnInS, ZnInSe, ZnMgO, Zn(Se, OH), ZnSnO, ZnO, InSe, InOH, In(OH, S), In (OOH, S), and In (S, 0).

14. The solar cell module according to claim 9, wherein the reflection preventing layer includes:
a first reflection preventing layer that is formed on the light absorption layer and includes $Al_2O_3$; and
a second reflection preventing layer that is formed on the first reflection preventing layer and includes $MgF_2$.

15. The solar cell module according to claim 9, wherein the transparent electrode includes:
a lower transparent electrode that includes n-ZnO; and
an upper transparent electrode that is formed on the lower transparent electrode and includes i-ZnO.

* * * * *